US011476186B2

(12) United States Patent
Vilangudipitchai et al.

(10) Patent No.: US 11,476,186 B2
(45) Date of Patent: Oct. 18, 2022

(54) MIMCAP ARCHITECTURE

(71) Applicant: QUALCOMM Incorporated, San Diego, CA (US)

(72) Inventors: Ramaprasath Vilangudipitchai, San Diego, CA (US); Gudoor Reddy, Berkeley, CA (US); Samrat Sinharoy, San Diego, CA (US); Smeeta Heggond, Bagalkot (IN); Anil Kumar Koduru, San Diego, CA (US); Kamesh Medisetti, Bangalore (IN); Seung Hyuk Kang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 29 days.

(21) Appl. No.: 17/081,720

(22) Filed: Oct. 27, 2020

(65) Prior Publication Data
US 2021/0391249 A1 Dec. 16, 2021

(30) Foreign Application Priority Data

Jun. 10, 2020 (IN) .............................. 202041024347

(51) Int. Cl.
*H01L 23/522* (2006.01)
*H01L 27/02* (2006.01)

(52) U.S. Cl.
CPC ...... *H01L 23/5223* (2013.01); *H01L 23/5226* (2013.01); *H01L 27/0207* (2013.01)

(58) Field of Classification Search
CPC ............. H01L 23/5223; H01L 23/5226; H01L 27/0207
(Continued)

(56) References Cited

U.S. PATENT DOCUMENTS 6,191,479 B1 2/2001 Herrell et al.
7,500,211 B2 3/2009 Komaki
(Continued)

OTHER PUBLICATIONS

International Search Report and Written Opinion—PCT/US2021/031640—ISAEPO—dated Aug. 6, 2021.
(Continued)

*Primary Examiner* — Tu-Tu V Ho
(74) *Attorney, Agent, or Firm* — Procopio, Cory, Hargreaves & Savitch LLP

(57) ABSTRACT

A cell on an IC includes a first set of $M_x$ layer interconnects coupled to a first voltage, a second set of $M_x$ layer interconnects coupled to a second voltage different than the first voltage, and a MIM capacitor structure below the $M_x$ layer. The MIM capacitor structure includes a CTM, a CBM, and an insulator between portions of the CTM and the CBM. The first set of $M_x$ layer interconnects is coupled to the CTM. The second set of $M_x$ layer interconnects is coupled to the CBM. The MIM capacitor structure is between the $M_x$ layer and an $M_{x-1}$ layer. The MIM capacitor structure includes a plurality of openings. The MIM capacitor structure is continuous within the cell and extends to at least two edges of the cell. In one configuration, the MIM capacitor structure extends to each edge of the cell.

28 Claims, 13 Drawing Sheets

(58) Field of Classification Search
USPC .......................................................... 257/532
See application file for complete search history.

(56) References Cited

U.S. PATENT DOCUMENTS

| | | |
|---|---|---|
| 9,876,007 B1 | 1/2018 | Cohen et al. |
| 9,960,111 B2 | 5/2018 | Jen et al. |
| 10,157,976 B2 | 12/2018 | Tu et al. |
| 2018/0226453 A1* | 8/2018 | Yi ...................... G11C 13/0007 |
| 2018/0294226 A1 | 10/2018 | Lee et al. |
| 2020/0098853 A1 | 3/2020 | Haraguchi et al. |

OTHER PUBLICATIONS

Sanchez, H., et al., "Increasing Microprocessor Speed by Massive Application of On-Die High-K MIM Decoupling Capacitors", Digest of Technical Papers/2006 IEEE International Solid-State Circuits Conference, San Francisco, CA, Feb. 5-9, 2006, IEEE Service Center, Piscataway, NJ, US, Feb. 6, 2006 (Feb. 6, 2006), XP031741814, pp. 2190-2199, ISBN : 978-1-4244-0079-9 the whole document.

* cited by examiner

US 11,476,186 B2

MIMCAP ARCHITECTURE

CROSS REFERENCE TO RELATED APPLICATION(S)

This application claims the benefit of Indian Patent Application No. 202041024347, entitled "MIMCAP ARCHITECTURE" and filed on Jun. 10, 2020, which is expressly incorporated by reference herein in its entirety.

BACKGROUND

Field

The present disclosure relates generally to a metal-insulator-metal (MIM) capacitor (MIMCAP) architecture, and more particularly, to a custom MIMCAP layout architecture for supporting high frequency and low voltage drop requirements.

Background

A standard cell device is an integrated circuit (IC) that implements digital logic. Such standard cell device may be reused multiple times within an application-specific IC (ASIC). An ASIC, such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or fin FETs (FinFETs)) and connect the transistors into circuits.

IC MIMCAPs may reduce voltage fluctuations and noise on the power supply through a provided decoupling capacitance. There is currently a need for cell MIMCAPs with a greater provided decoupling capacitance.

SUMMARY

In an aspect of the disclosure, a cell on an IC is provided. The cell includes a first set of metal x ($M_x$) layer interconnects coupled to a first voltage, and a second set of $M_x$ layer interconnects coupled to a second voltage different than the first voltage. The cell further includes a MIM capacitor structure below the $M_x$ layer. The MIM capacitor structure includes a capacitor top metal (CTM), a capacitor bottom metal (CBM), and an insulator between portions of the CTM and the CBM. The first set of $M_x$ layer interconnects is coupled to the CTM. The second set of $M_x$ layer interconnects is coupled to the CBM. The MIM capacitor structure is between the $M_x$ layer and a metal x-1 ($M_{x-1}$) layer. The MIM capacitor structure includes a plurality of openings. The MIM capacitor structure is continuous within the cell and extends to at least two edges of the cell.

In an aspect of the disclosure, an IC is provided. The IC includes a plurality of abutting cells. Each cell includes a first set of $M_x$ layer interconnects coupled to a first voltage, and a second set of $M_x$ layer interconnects coupled to a second voltage different than the first voltage. Each cell further includes a MIM capacitor structure below the $M_x$ layer. The MIM capacitor structure includes a CTM, a CBM, and an insulator between portions of the CTM and the CBM. The first set of $M_x$ layer interconnects is coupled to the CTM. The second set of $M_x$ layer interconnects is coupled to the CBM. The MIM capacitor structure is between the $M_x$ layer and an $M_{x-1}$ layer. The MIM capacitor structure includes a plurality of openings. The MIM capacitor structure is continuous across the plurality of cells.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
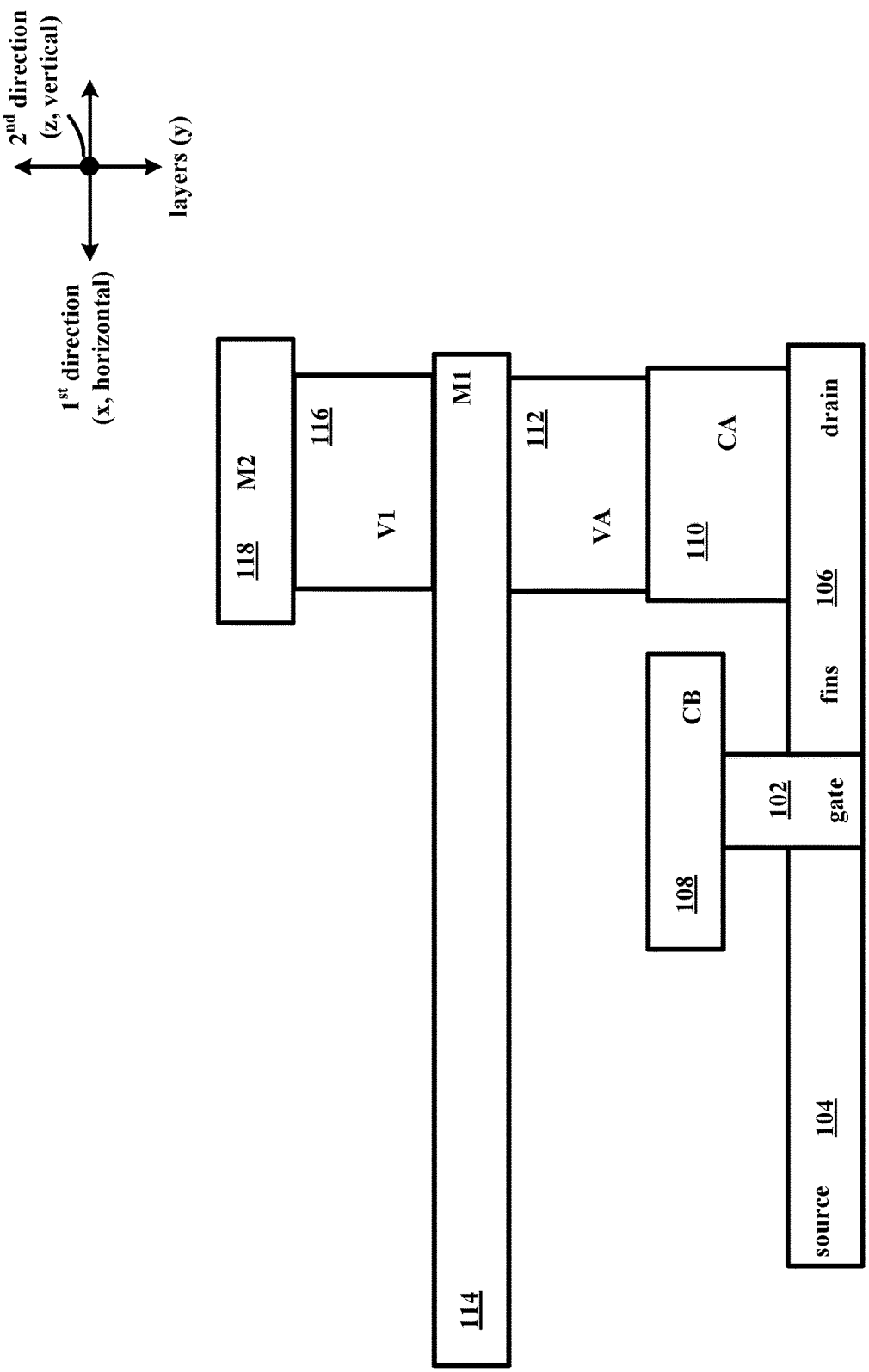
FIG. 1 is a first diagram illustrating a side view of various layers within a standard cell and IC.

FIG. 1 is a first diagram 100 illustrating a side view of various layers within a standard cell and IC. The various layers change in the y direction. As illustrated in FIG. 1, a transistor has a gate 102 (which may be referred to as POLY in some instances even though the gate may be formed of metal, polysilicon, or a combination of polysilicon and metal), a source 104, and a drain 106. The source 104 and the drain 106 may be formed by fins. The gate 102 may extend in a second direction (e.g., vertical direction along the z axis coming out of the page), and the fins may extend in a first direction orthogonal to the second direction (e.g., horizontal direction along the x axis). A contact B (CB) layer interconnect 108 (also referred to as a metal POLY (MP) layer interconnect) may contact the gate 102. A contact A (CA) layer interconnect 110 (also referred to as a metal diffusion (MD) layer interconnect) may contact the source 104 and/or the drain 106. A via 112 (which may be referred to as via A (VA)) may contact the CA layer interconnect 110.

A metal 1 (M1) layer interconnect 114 may contact the via VA 112. The M1 layer interconnect 114 may extend in the first direction only (i.e., unidirectional in the first direction) or in the second direction only (i.e., unidirectional in the second direction). The M1 layer interconnect 114 is illustrated as being unidirectional in the first direction, but alternatively may be unidirectional in the second direction. A via V1 116 may contact the M1 layer interconnect 114. A metal 2 (M2) layer interconnect 118 may contact the via V1 116. The M2 layer interconnect 118 may extend in the second direction only (i.e., unidirectional in the second direction). As illustrated, the M2 layer is a lowest vertical layer (i.e., unidirectional in the second direction). Specifically, the M2 layer may be unidirectional in the vertical direction, and is the closest vertically unidirectional layer to the silicon substrate. Higher layers include a via layer including vias V2 and a metal 3 (M3) layer including M3 layer interconnects. The M3 layer interconnects may extend in the first direction.

Figure 2:
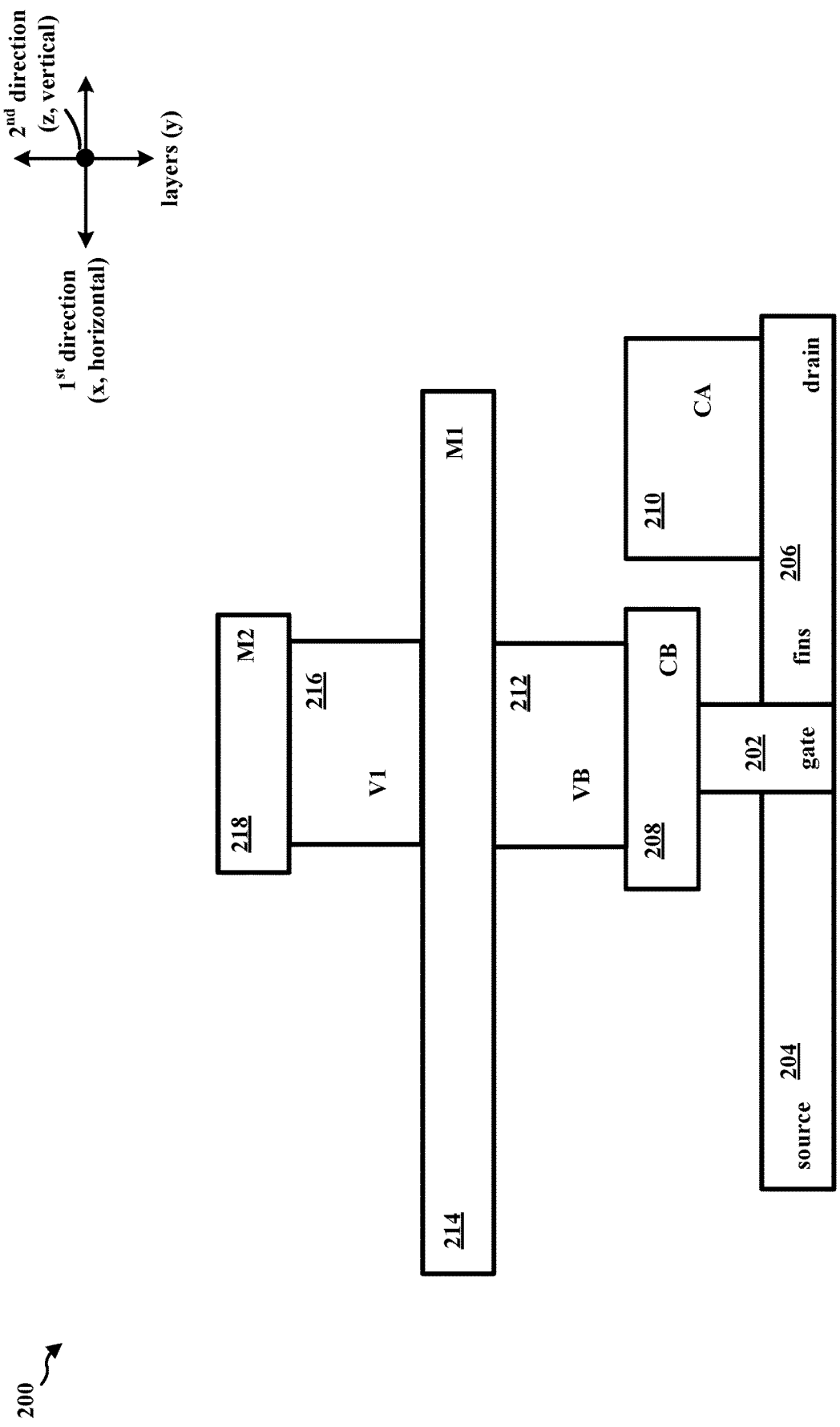
FIG. 2 is a second diagram illustrating a side view of various layers within a standard cell and IC.

FIG. 2 is a second diagram 200 illustrating a side view of various layers within a standard cell and IC. The various layers change in the y direction. As illustrated in FIG. 2, a transistor has a gate 202, a source 204, and a drain 206. The source 204 and the drain 206 may be formed by fins. The gate 202 may extend in a second direction (e.g., vertical direction along the z axis coming out of the page), and the fins may extend in a first direction orthogonal to the second direction (e.g., horizontal direction along the x axis). A CB layer interconnect 208 may contact the gate 202. A CA layer interconnect 210 may contact the source 204 and/or the drain 206. A via 212 (which may be referred to as via B (VB)) may contact the CB layer interconnect 208. An M1 layer interconnect 214 may contact the via VB 212. The M1 layer interconnect 214 may extend in the first direction only (i.e., unidirectional in the first direction) or in the second direction only (i.e., unidirectional in the second direction). The M1 layer interconnect 214 is illustrated as being unidirectional in the first direction, but alternatively may be unidirectional in the second direction. A via V1 216 may contact the M1 layer interconnect 214. An M2 layer interconnect 218 may contact the via V1 216. The M2 layer interconnect 218 may extend in the second direction only (i.e., unidirectional in the second direction). As illustrated, the M2 layer is a lowest vertical layer (i.e., unidirectional in the second direction). Specifically, the M2 layer may be unidirectional in the vertical direction, and is the closest vertically unidirectional layer to the silicon substrate. Higher layers include a via layer including vias V2 and an M3 layer including M3 layer interconnects. The M3 layer interconnects may extend in the first direction.

Deep learning is creating insatiable computation demands for training and inference.

Inference engines using deep learning models may have 100 k or more requests per second, with minimum latency and a billion users. Techniques like automated machine learning (AutoML) (e.g., learning to learn, neural architecture, search) can multiply training computation by 5×-1000×. Concurrent activation of multiple high frequency neural signal processor (NSP) cores is expected for most machine learning applications. High frequency applications may need a fast cycle ramp up. Existing decoupling capacitor designs still end up with a high voltage drop (also referred to as IR drop) during ramp up. Any additional voltage drop may reduce processor performance. Accordingly, additional decoupling capacitance may be needed to meet performance needs.

As discussed infra, a MIMCAP architecture is provided that provides an additional decoupling capacitance without an increase in surface area. The MIMCAP architecture includes cells with a MIMCAP where the MIMCAP is continuous within each cell and is continuous across abutted cells in an IC. With the custom MIMCAP architecture, decoupling capacitance may be increased by as much as 66%. Further, the MIMCAP architecture provides for cell derivatives with varying MIMCAP equivalent series resistance (ESR) options, where the ESR of the MIMCAP is tunable/adaptable in order to affect a cutoff frequency of the decoupling capacitor.

Figure 3:
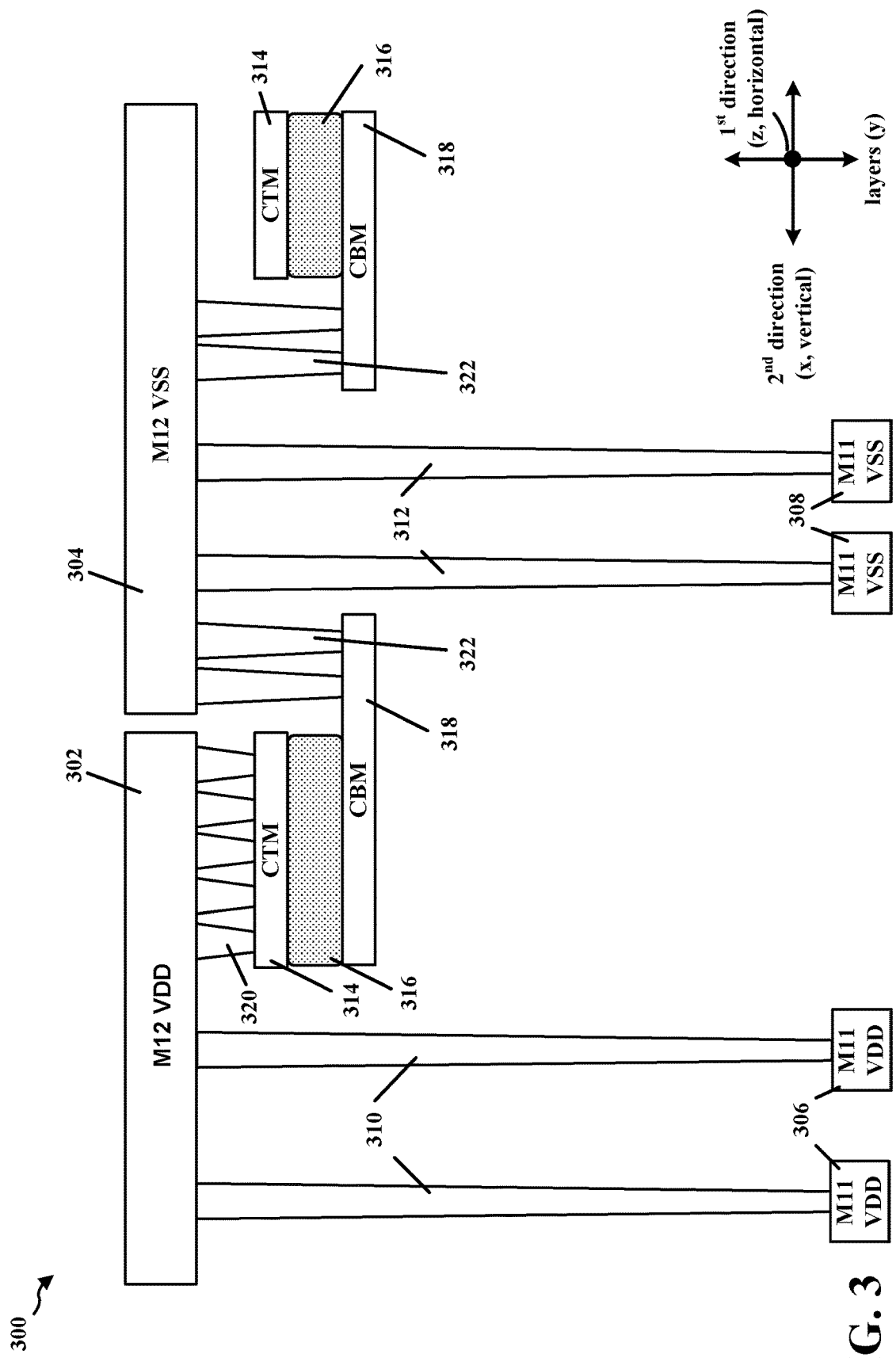
FIG. 3 is a diagram conceptually illustrating a side-view of a MIMCAP structure.

FIG. 3 is a diagram 300 conceptually illustrating a side-view of a MIMCAP structure. The MIMCAP structure includes M12 layer interconnects 302, 304, where the M12 layer interconnect 302 is coupled to a power supply voltage Vdd and the M12 layer interconnect 304 is coupled to a ground voltage Vss. The M12 layer interconnect 302 is coupled to M11 layer interconnects 306 through vias 310. The M12 layer interconnect 304 is coupled to M11 layer interconnects 308 through vias 312. The M12 layer interconnects 302, 304 and the M11 layer interconnects 306, 308 are part of a power grid for an IC. Between the M11 and M12 layers is a MIMCAP including a CTM 314, a CBM 318, and an insulator 316 between the CTM 314 and the CBM 318. The CTM 314 and the CBM 318 may be formed of a conductive material, such as for example, aluminum, tantalum, niobium, or other metals. The insulator 316 is an electrical insulator known as a dielectric, and may be formed of an oxide (e.g., $SiO_2$) or other dielectric material. The CTM 314 may be coupled to the power supply voltage Vdd through vias 320. The CBM 318 may be coupled to the ground voltage Vss through vias 322. While the diagram 300 illustrates the CTM and the CBM coupled to the power supply voltage Vdd and the ground voltage Vss, respectively, alternatively the CTM and the CBM may be coupled to the ground voltage Vss and the power supply voltage Vdd, respectively. While the diagram 300 illustrates a MIMCAP between the M12 and M11 layers, generally the MIMCAP may be between an $M_x$ layer and an $M_{x-1}$ layer, where x≥2.

Figure 4:
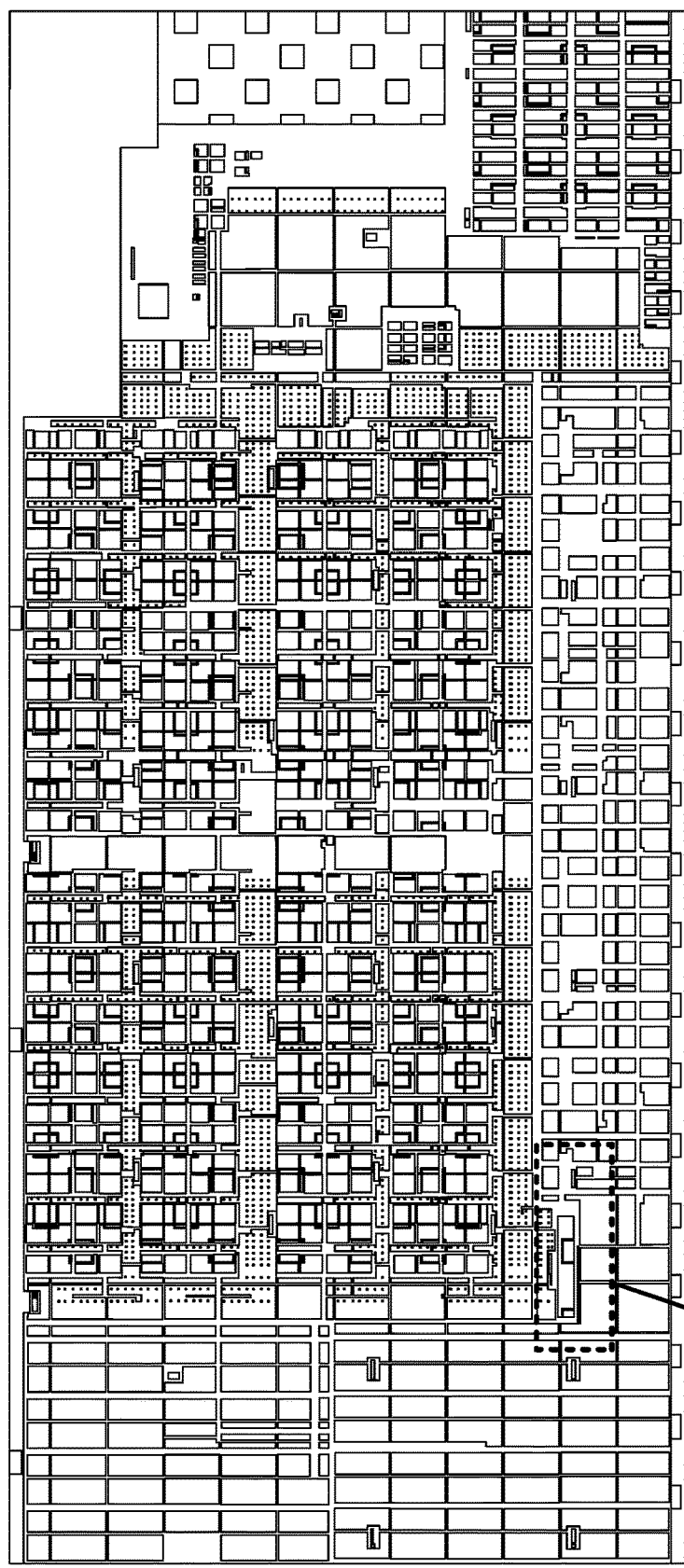
FIG. 4 is a diagram illustrating a first top-view of a MIMCAP structure.
Figure 5:
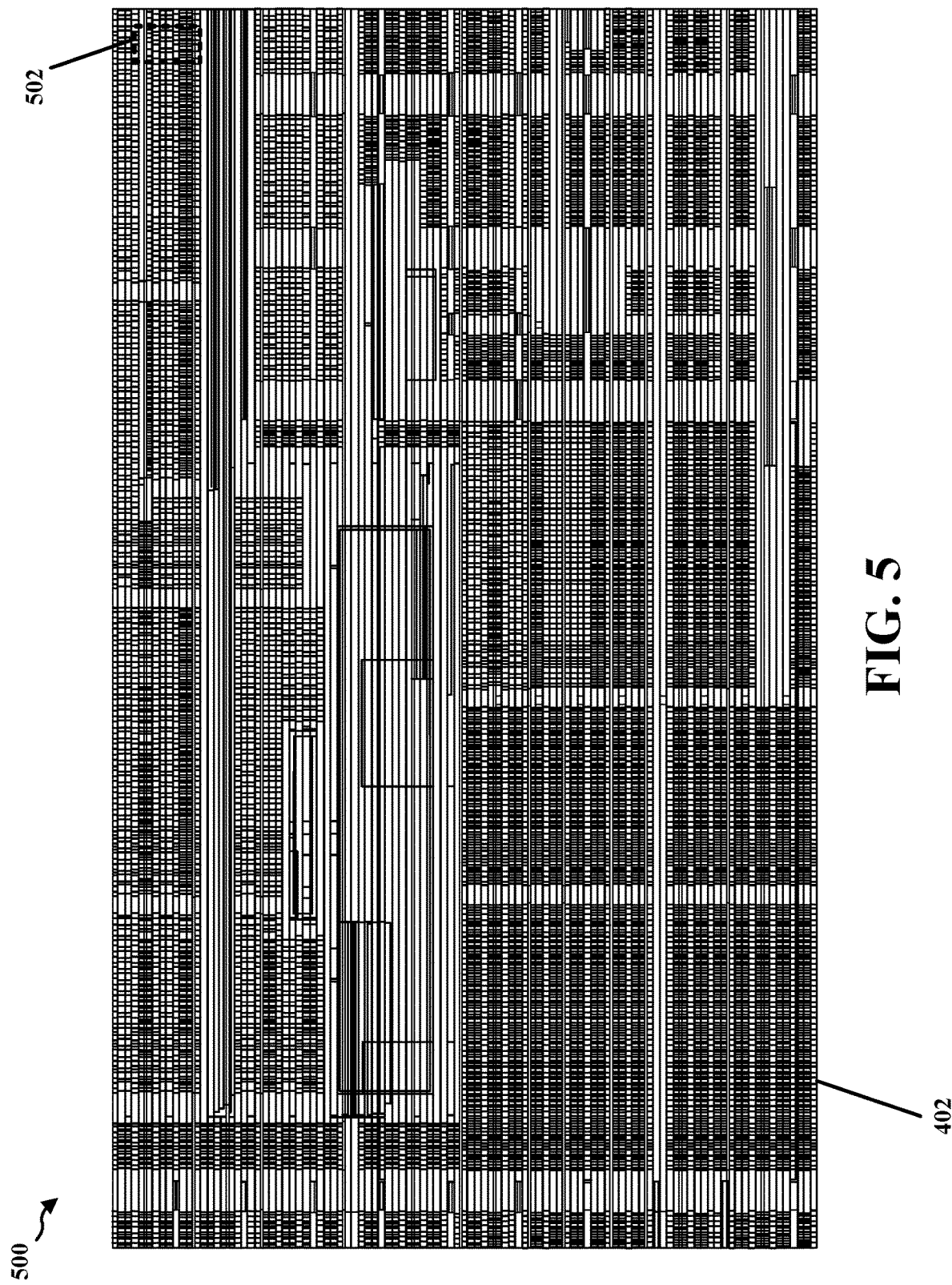
FIG. 5 is a diagram illustrating a second top-view of a MIMCAP structure.
Figure 6:
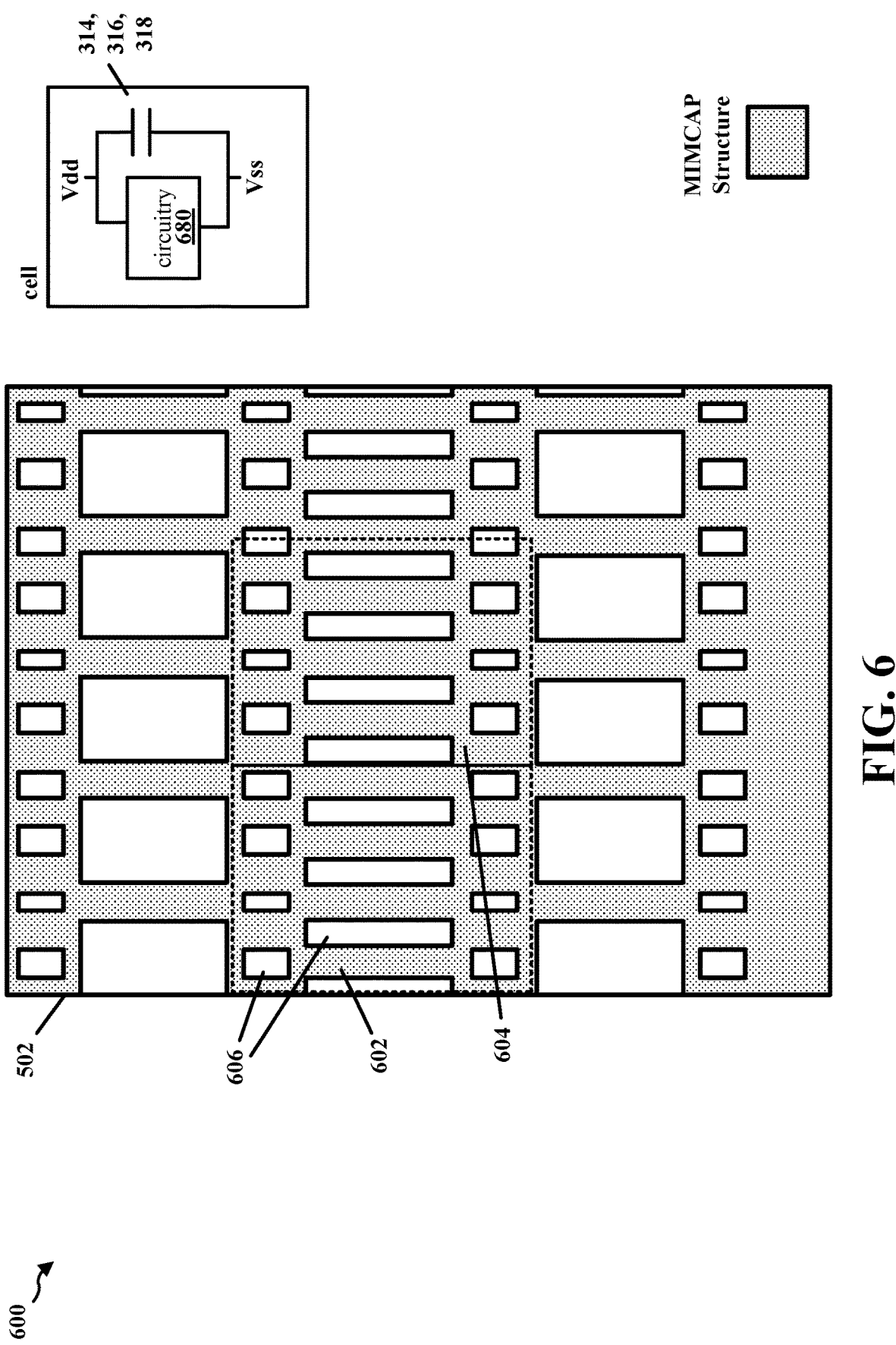
FIG. 6 is a diagram illustrating a third top-view of a MIMCAP structure.

FIG. 4 is a diagram 400 illustrating a first top-view of a MIMCAP structure. FIG. 5 is a diagram 500 illustrating a second top-view of a MIMCAP structure. FIG. 6 is a diagram 600 illustrating a third top-view of a MIMCAP structure. The cut portion 402 of FIG. 4 is illustrated in FIG. 5. The cut portion 502 of FIG. 5 is illustrated in FIG. 6. FIG. 6 illustrates two cells 602, 604 within the cut portion 502, where the MIMCAP structure is continuous within each cell 602, 604 and extends to each edge of the cell. Accordingly, as the MIMCAP structure extends to each edge of the cell, the MIMCAP structure is continuous across the cells 602, 604. Within the MIMCAP structure within each cell are a plurality of openings 606 for allowing the power supply voltage Vdd and the ground voltage Vss to be fed through from the $M_x$ layer interconnects to the $M_{x-1}$ layer interconnects (see FIG. 3, where the vias 310, 312 extend down through the openings 606 in the MIMCAP structure). As illustrated in FIG. 6, each cell includes IC circuitry 680 and the MIMCAP 314, 316, 318, both of which are coupled to the power supply voltage Vdd and the ground voltage Vss.

Figure 7:
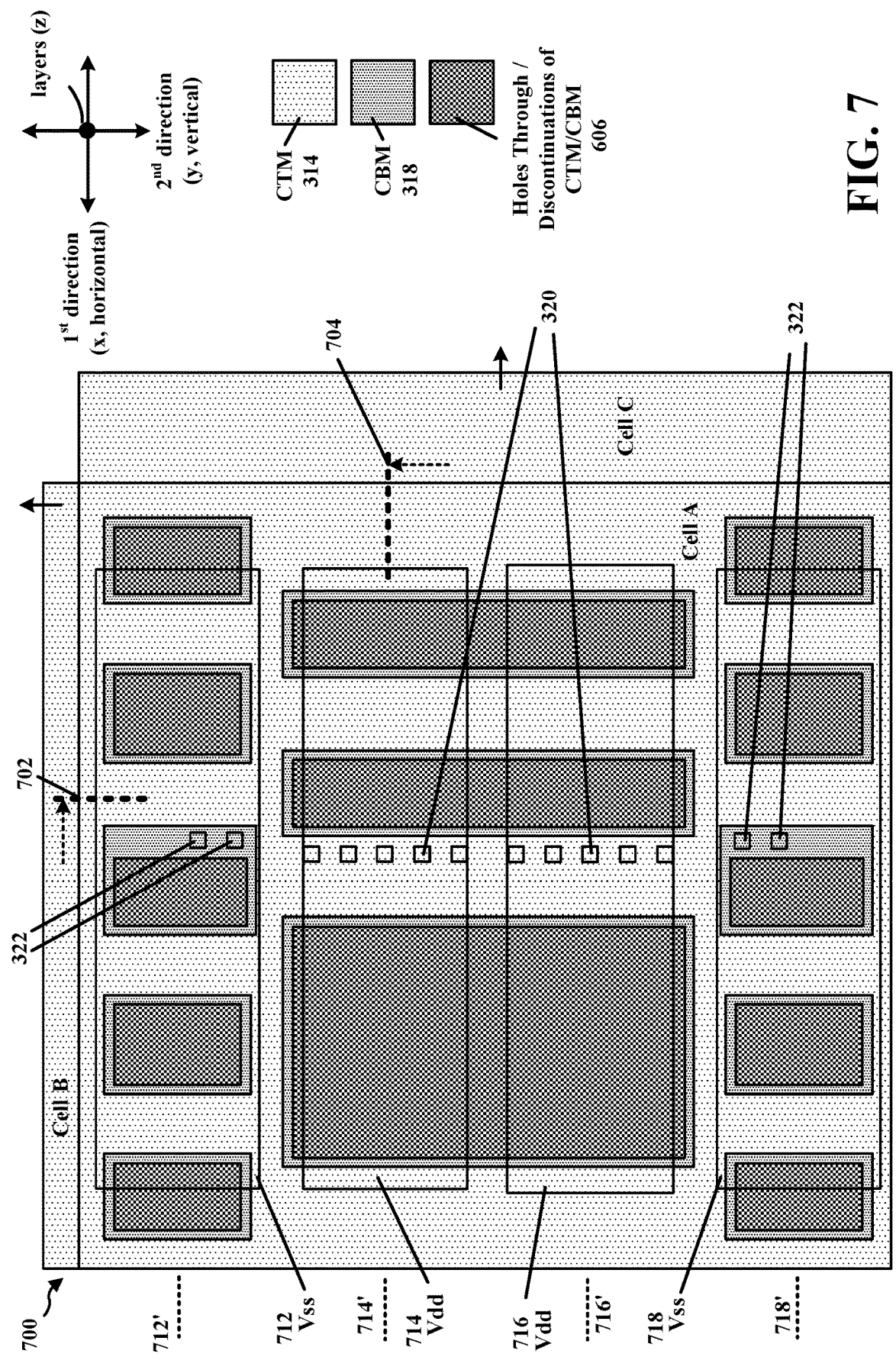
FIG. 7 is a diagram conceptually illustrating a top-view of a first configuration of a MIMCAP structure.
Figure 8:
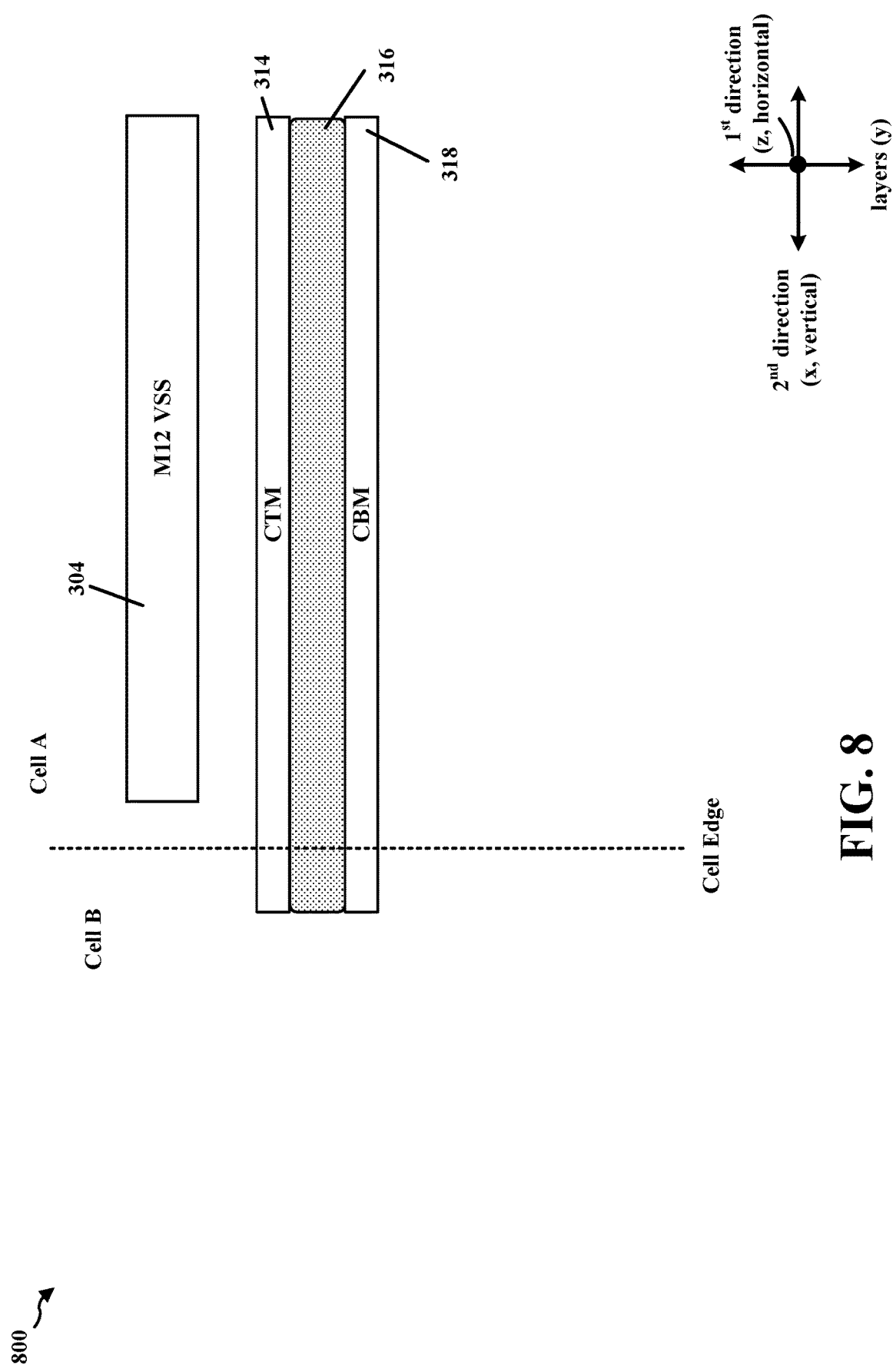
FIG. 8 is a diagram conceptually illustrating a first side-view of a MIMCAP structure.
Figure 9:
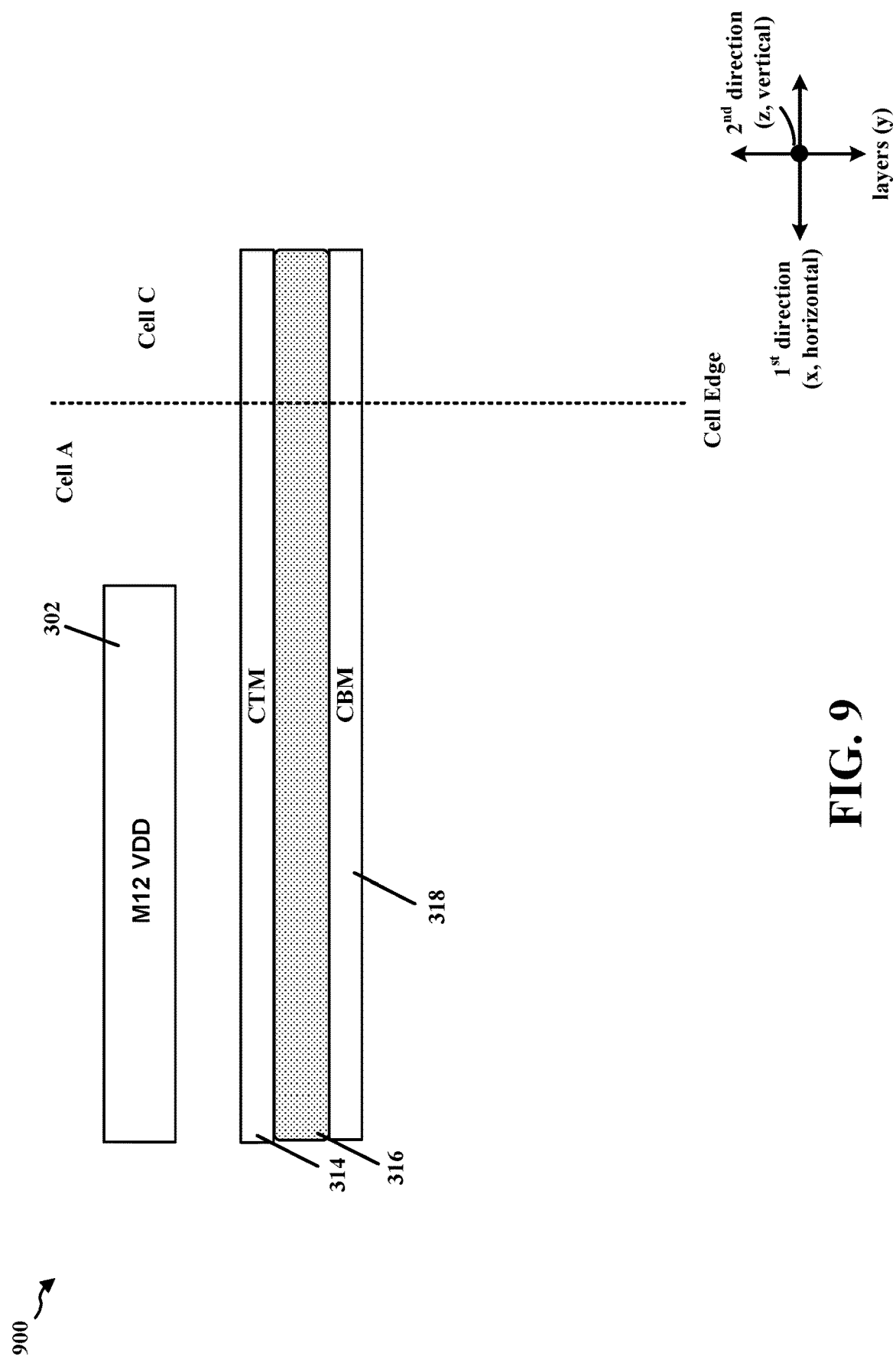
FIG. 9 is a diagram conceptually illustrating a second side-view of a MIMCAP structure.

FIG. 7 is a diagram 700 conceptually illustrating a top-view of a first configuration of a MIMCAP structure. FIG. 8 is a diagram 800 conceptually illustrating a first side-view of a MIMCAP structure. FIG. 9 is a diagram 900 conceptually illustrating a second side-view of a MIMCAP structure. Referring to FIG. 7, cell A may be one of the cells 602 or 604 of FIG. 6. The cell A is adjacent to a cell B in the second direction (vertical direction) and to a cell C in the first direction (horizontal direction). Only portions of the cells B, C are illustrated. Cut view 702 across the cells A, B is illustrated in FIG. 8. Referring to FIG. 8, the MIMCAP structure is continuous to the edges of the cells A, B, and together provides for the MIMCAP structure to be continuous across the cells A, B. Cut view 704 across the cells A, C is illustrated in FIG. 9. Referring to FIG. 9, the MIMCAP structure is continuous to the edges of the cells A, C, and together provides for the MIMCAP structure to be continuous across the cells A, C.

Referring again to FIG. 7, the cell A includes a first set of $M_x$ layer interconnects 714, 716 coupled to a first voltage (e.g., the power supply voltage Vdd). The cell A further includes a second set of $M_x$ layer interconnects 712, 718 coupled to a second voltage (e.g., the ground voltage Vss) different than the first voltage. The cell A further includes a MIM capacitor structure below the $M_x$ layer. The MIM capacitor structure includes a CTM, a CBM, and an insulator between portions of the CTM and the CBM. The first set of $M_x$ layer interconnects 714, 716 may be connected to the CTM through vias 320. The CBM may have a greater surface area than the CTM and extend past the CTM in the top view so as to allow access for vias 322 to connect the CBM to the second set of $M_x$ layer interconnects 712, 718. The MIM capacitor structure is between the $M_x$ layer and the $M_{x-1}$ layer. The MIM capacitor structure includes a plurality of openings 606 through which the first set of $M_x$ layer interconnects 714, 716 and the second set of $M_x$ layer interconnects 712, 718 may be connected to the power grid on the $M_{x-1}$ layer (see FIG. 3). As illustrated in FIG. 7, the MIM capacitor structure is continuous within the cell and extends to each edge of the cell. In a first configuration, the MIM capacitor structure may extend to the edges of the cell in the first direction, thereby allowing the MIM capacitor structure to be continuous across cells A, C. In a second configuration, the MIM capacitor structure may extend to the edges of the cell in the second direction, thereby allowing the MIM capacitor structure to be continuous across the cells A, B. In a third configuration, the MIM capacitor structure extends to each edge of the cell, thereby allowing the MIM capacitor structure to be continuous across the cells A, B, C. As should be clear in the third configuration, any arrangement of N adjacent abutting cells, in any orientation, would allow the MIM capacitor structure to be continuous across the N cells.

As illustrated in FIG. 7, the cell A has a top edge, a right edge, a bottom edge, and a left edge with a plurality of $M_x$ layer tracks 712', 714', 716', 718' corresponding to the interconnects 712, 714, 716, 718 extending in a first direction between the left edge and the right edge along tracks 712', 714', 716', 718', respectively. The plurality of $M_x$ layer tracks 712', 714', 716', 718' include a first $M_x$ layer track 712' adjacent to the top edge, a second $M_x$ layer track 714' adjacent to the first $M_x$ layer track 712', a third $M_x$ layer track 716' adjacent to the second $M_x$ layer track 714', and a fourth $M_x$ layer track 718' adjacent to the third $M_x$ layer track 716' and the bottom edge. The first set of $M_x$ layer interconnects 714, 716 includes a first $M_x$ layer interconnect 714 on the second $M_x$ layer track 714', and a second $M_x$ layer interconnect 716 on the third $M_x$ layer track 716'. The second set of $M_x$ layer interconnects 712, 718 includes a first $M_x$ layer interconnect 712 on the first $M_x$ layer track 712', and a second $M_x$ layer interconnect 718 on the fourth $M_x$ layer track 718'. The first set of $M_x$ layer interconnects 714, 716 is illustrated with 10 vias coupled to the CTM and the second set of $M_x$ layer interconnects 712, 718 is illustrated with 4 vias coupled to the CBM. The illustration of 10 and 4 vias is exemplary only, and more or less vias may be used to couple the CTM/CBM to the power supply voltage Vdd and the ground voltage Vss. In alternative configurations, in order to increase the ESR and reduce the cutoff frequency of the MIMCAP (the cutoff frequency is inversely proportional to the ESR), more or less vias may be used to couple the first set of $M_x$ layer interconnects to the CTM and the second set of $M_x$ layer interconnects to the CBM. Alternative configurations are provided infra with respect to FIGS. 10, 11, 12, 13.

Figure 10:
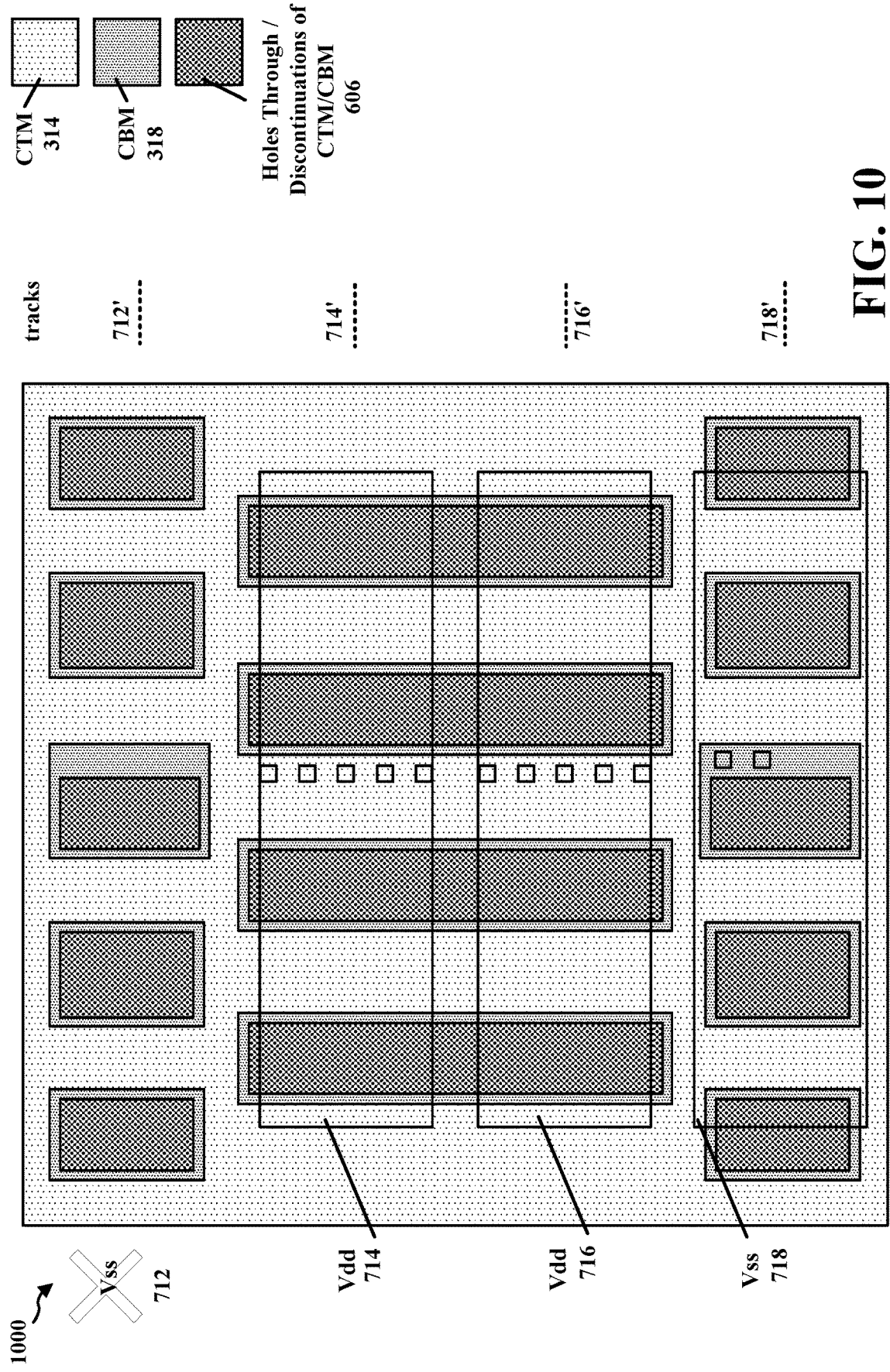
FIG. 10 is a diagram conceptually illustrating a top-view of a second configuration of a MIMCAP structure.
Figure 11:
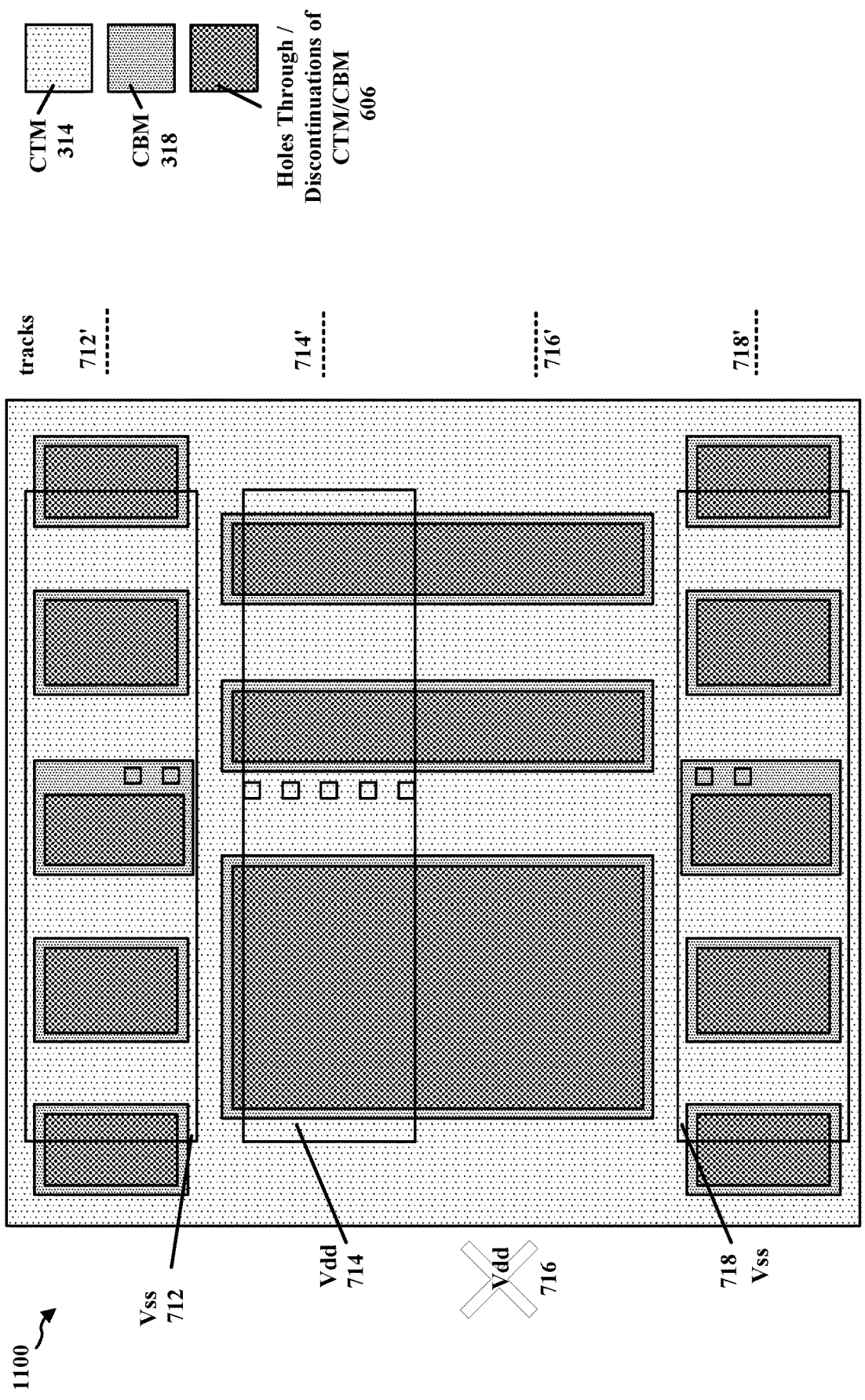
FIG. 11 is a diagram conceptually illustrating a top-view of a third configuration of a MIMCAP structure.
Figure 12:
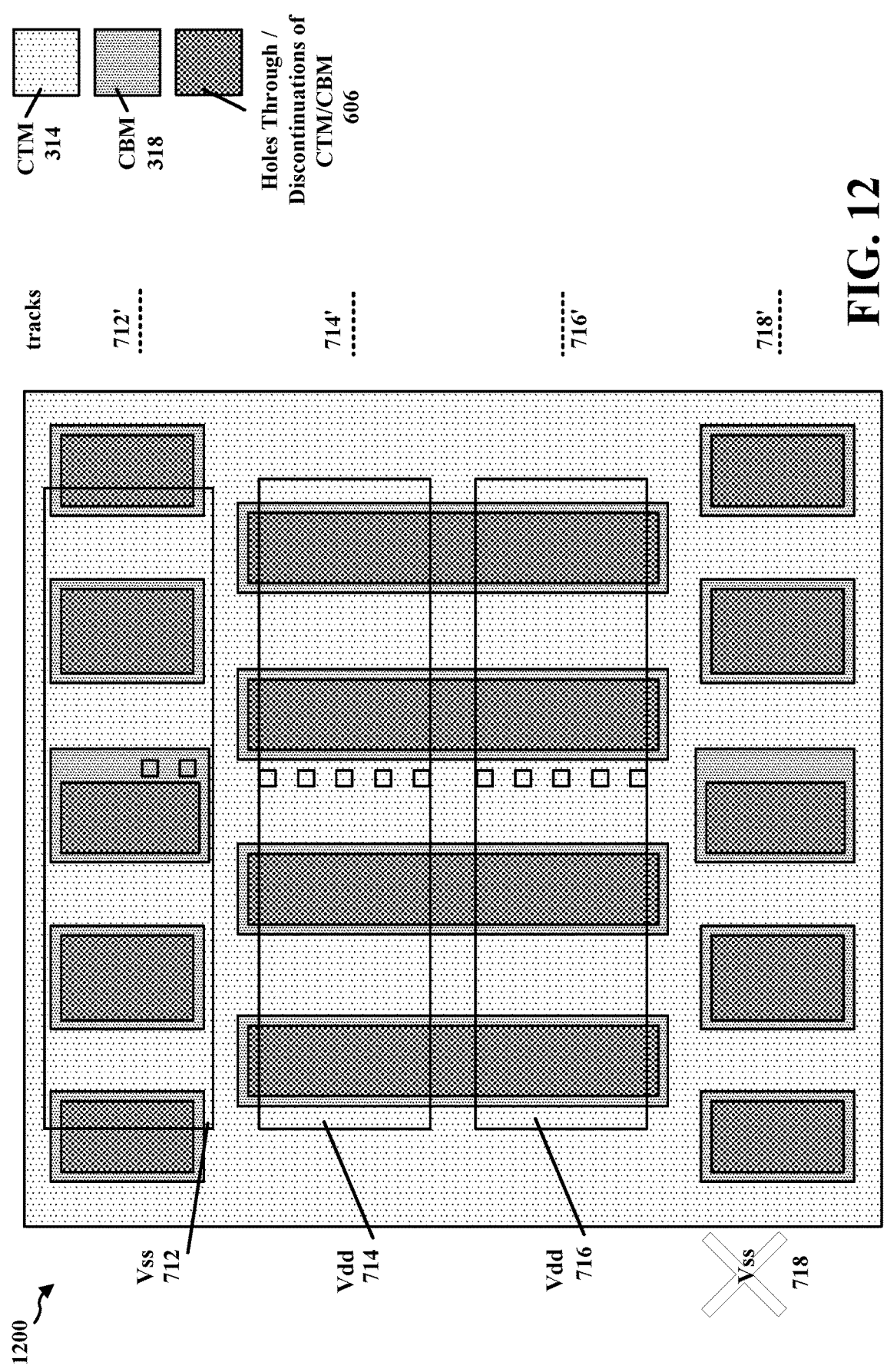
FIG. 12 is a diagram conceptually illustrating a top-view of a fourth configuration of a MIMCAP structure.
Figure 13:
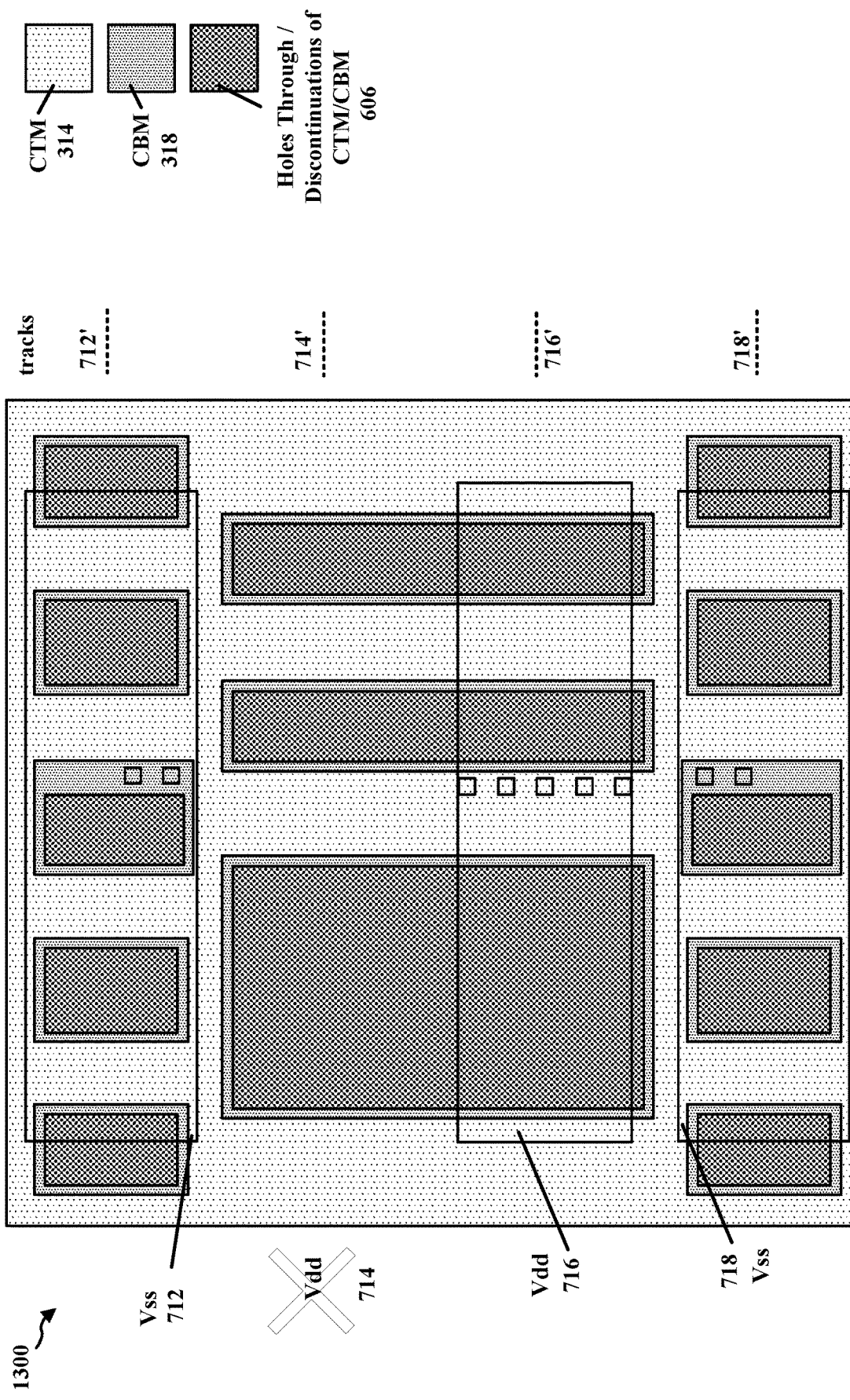
FIG. 13 is a diagram conceptually illustrating a top-view of a fifth configuration of a MIMCAP structure.

FIG. 10 is a diagram 1000 conceptually illustrating a top-view of a second configuration of a MIMCAP structure. FIG. 11 is a diagram 1100 conceptually illustrating a top-view of a third configuration of a MIMCAP structure. FIG. 12 is a diagram 1200 conceptually illustrating a top-view of a fourth configuration of a MIMCAP structure. FIG. 13 is a diagram 1300 conceptually illustrating a top-view of a fifth configuration of a MIMCAP structure. Referring to FIG. 10, the first set of $M_x$ layer interconnects 714, 716 includes a first $M_x$ layer interconnect 714 on the second $M_x$ layer track 714', and a second $M_x$ layer interconnect 716 on the third $M_x$ layer track 716'. The second set of $M_x$ layer interconnects 718 includes a first $M_x$ layer interconnect 718 on the fourth $M_x$ layer track 718', and the first $M_x$ layer track 712' is empty. Referring to FIG. 12, in an alternative configuration, the second set of $M_x$ layer interconnects may include a first $M_x$ layer interconnect 712 on the first $M_x$ layer track 712', and the fourth $M_x$ layer track 718' may be empty. Accordingly, the first set of $M_x$ layer interconnects 714, 716 is illustrated with 10 vias coupled to the CTM and the second set of $M_x$ layer interconnects 718 (FIG. 10) or 712 (FIG. 12) is illustrated with 2 vias coupled to the CBM. With less vias connecting the CBM to the second voltage than the MIMCAP of FIG. 7, an ESR of the MIMCAP is increased, and therefore the cutoff frequency $f_c$ of the MIMCAPs of FIGS. 10, 12 are less than the cutoff frequency $f_c$ of the MIMCAP of FIG. 7. Referring to FIG. 11, the first set of $M_x$ layer interconnects 714 includes a first $M_x$ layer interconnect 714 on the second $M_x$ layer track 714', and the third $M_x$ layer track 716' is empty. The second set of $M_x$ layer interconnects 712, 718 includes a first $M_x$ layer interconnect 712 on the first $M_x$ layer track 712', and a second $M_x$ layer interconnect 718 on the fourth $M_x$ layer track 718'. Referring to FIG. 13, in an alternative configuration, the first set of $M_x$ layer interconnects may include a first $M_x$ layer interconnect 716 on the third $M_x$ layer track 716', and the second $M_x$ layer track 714' may be empty. Accordingly, the first set of $M_x$ layer interconnects 714 (FIG. 11) or 716 (FIG. 13) is illustrated with 5 vias coupled to the CTM and the second set of $M_x$ layer interconnects 712, 718 is illustrated with 4 vias coupled to the CBM. With less vias connecting the CTM to the first voltage than the MIMCAP of FIG. 7, an ESR of the MIMCAP is increased, and therefore the cutoff frequency $f_c$ of the MIMCAPs of FIGS. 11, 13 is less than the cutoff frequency $f_c$ of the MIMCAP of FIG. 7. As illustrated, the first voltage is a power supply voltage Vdd, and the second voltage is a ground voltage Vss. However, the second voltage may be a power supply voltage Vdd, and the first voltage may be a ground voltage Vss.

Referring again to FIGS. 10, 11, 12, 13, any combinations of tracks may be used. If $n_1$ vias are provided on track 712', $n_2$ vias are provided on track 714', $n_3$ vias are provided on track 716', and $n_4$ vias are provided on 718', then the CBM may be configured to include $n_1$, $n_4$, or $n_1+n_4$ vias for the connection to the second voltage, and the CTM may be configured to include $n_2$, $n_3$, or $n_2+n_3$ vias for the connection to the first voltage, thus providing 9 different ESR/cutoff frequency $f_c$ MIMCAP options/alternatives.

As discussed supra, one or two of the first set of $M_x$ layer interconnects 714, 716 is coupled to the CTM and one or two of the second set of $M_x$ layer interconnects 712, 718 is coupled to the CBM. To allow for the connections to the CBM, the openings 606 for the second set of $M_x$ layer interconnects 712, 718 provide for a larger opening within the CTM than the CBM, exposing the CBM for the via contacts. In an alternative configuration, one or two of the first set of $M_x$ layer interconnects 714, 716 may be coupled to the CBM and one or two of the second set of $M_x$ layer interconnects 712, 718 may be coupled to the CTM. To allow for the connections to the CBM, the openings 606 for the first set of $M_x$ layer interconnects 714, 716 may provide for a larger opening within the CTM than the CBM, exposing the CBM for the via contacts.

As discussed supra, four tracks are provided within each cell, with one or two $M_x$ layer interconnects coupled to the CTM and one or two $M_x$ layer interconnects coupled to the CBM. In general, one to TT $M_x$ layer interconnects on TT possible tracks may be coupled to the CTM, and one to TB $M_x$ layer interconnects on TB possible tracks may be coupled to the CBM. As such, a cell may include $T_T$+TB tracks, and different numbers of such tracks may be utilized for adjusting the cutoff frequency/ESR for the cell.

Referring again to FIGS. 6-13, an IC may include a plurality of abutting cells 602, 604. Each cell may include a first set of $M_x$ layer interconnects 714 and/or 716 coupled to a first voltage. Each cell may further include a second set of $M_x$ layer interconnects 712 and/or 718 coupled to a second voltage different than the first voltage. Each cell may further include a MIM capacitor structure below the $M_x$ layer. The MIM capacitor structure includes a CTM 314, a CBM 318, and an insulator 316 between portions of the CTM 314 and the CBM 318. The first set of $M_x$ layer interconnects 714/716 is coupled to the CTM 314. The second set of $M_x$ layer interconnects 712/718 is coupled to the CBM 318. The MIM capacitor structure is between the $M_x$ layer and an $M_{x-1}$ layer. The MIM capacitor structure includes a plurality of openings 606 through which the first and second sets of $M_x$ layer interconnects 712, 714, 716, and/or 718 may be connected to $M_{x-1}$ layer interconnects for the power grid (see FIG. 3). The MIM capacitor structure is continuous across the plurality of cells 602, 604. As discussed in relations to FIGS. 10-13, in order to tune some cells to have a different frequency response/cutoff frequency than other cells, some cells may have more or less vias connecting the CTM and the CBM to the power supply voltage Vdd and the ground voltage Vss than other cells.

For example, the plurality of abutting cells 602, 604 may include a first set of cells 602 and a second set of cells 604. The first set of cells 602 may have a first number of vias coupling the CTM to the first voltage through at least one of the first set of $M_x$ layer interconnects. For example, the first set of cells 602 may have $n_{1\_2}$, $n_{1\_3}$, or $n_{1\_2}+n_{1\_3}$ vias coupling the CTM to the first voltage through the first set of $M_x$ layer interconnects. The second set of cells 604 may have a second number of vias coupling the CTM to the first voltage through at least one of the first set of $M_x$ layer interconnects. For example, the second set of cells 604 may have $n_{2\_2}$, $n_{2\_3}$, or $n_{2\_2}+n_{2\_3}$ vias coupling the CTM to the first voltage through the first set of $M_x$ layer interconnects. The first number of vias $n_{1\_2}$, $n_{1\_3}$, or $n_{1\_2}+n_{1\_3}$ may be different than the second number of vias $n_{2\_2}$, $n_{2\_3}$, or $n_{2\_2}+n_{2\_3}$. In such a configuration, as a result of the different number of vias connecting the CTM to the first voltage in the first and second set of cells 602, 604, the first set of cells 602 may have a cutoff frequency $f_{c1}$ and the second set of cells 604 may have a cutoff frequency $f_{c2}$, where $f_{c1} \ne f_{c2}$. As discussed supra, increasing the number of vias providing the connection of the CTM to the first voltage decreases the ESR and increases the cutoff frequency $f_c$. Within an IC, some decoupling capacitor/MIMCAP cells may be configured to have a higher cutoff frequency $f_c$/lower ESR than other decoupling capacitor/MIMCAP cells based on performance needs and their location within the IC.

For another example, the first set of cells 602 may have a first number of vias coupling the CBM to the second voltage through at least one of the second set of $M_x$ layer interconnects. For example, the first set of cells 602 may have $n_{1\_1}$, $n_{1\_4}$, or $n_{1\_1}+n_{1\_4}$ vias coupling the CBM to the second voltage through the second set of $M_x$ layer interconnects. The second set of cells 604 may have a second number of vias coupling the CBM to the second voltage through at least one of the second set of $M_x$ layer interconnects. For example, the second set of cells 604 may have $n_{2\_1}$, $n_{2\_4}$, or $n_{2\_1}+n_{2\_4}$ vias coupling the CBM to the second voltage through the second set of $M_x$ layer interconnects. The first number of vias $n_{1\_1}$, $n_{1\_4}$, or $n_{1\_1}+n_{1\_4}$ may be different than the second number of vias $n_{2\_1}$, $n_{2\_4}$, or $n_{2\_1}+n_{2\_4}$. In such a configuration, as a result of the different number of vias connecting the CBM to the second voltage in the first and second set of cells 602, 604, the first set of cells 602 may have a cutoff frequency $f_{c1}$ and the second set of cells 604 may have a cutoff frequency $f_{c2}$, where $f_{c1} \ne f_{c2}$. As discussed supra, increasing the number of vias providing the connection of the CBM to the second voltage decreases the ESR and increases the cutoff frequency $f_c$. In addition, within an IC, some decoupling capacitor/MIMCAP cells may be configured to have a higher cutoff frequency $f_c$/lower ESR than other decoupling capacitor/MIMCAP cells based on performance needs and their location within the IC.

As illustrated, the first voltage is a power supply voltage Vdd, and the second voltage is a ground voltage Vss. However, the second voltage may be a power supply voltage Vdd, and the first voltage may be a ground voltage Vss. For each cell, the MIM capacitor structure may be continuous within the cell and extend to at least two edges of the cell. For each cell, the MIM capacitor structure may be continuous within the cell and extend to each edge of the cell.

As discussed supra, a MIMCAP architecture is provided that provides an additional decoupling capacitance without an increase in cell/IC surface area. The MIMCAP architecture includes cells with a MIMCAP where the MIMCAP is continuous within each cell and is continuous across abutted cells in an IC. With the custom MIMCAP architecture, decoupling capacitance may be increased by as much as 66% and voltage/IR drop may be decreased by as much as 6.4% to provide a 3%-5% performance boost. Further, the MIMCAP architecture provides for cell derivatives with varying MIMCAP ESR options, where the ESR of the MIMCAP is tunable/adaptable in order to affect a cutoff frequency of the decoupling capacitor. MIMCAPs with higher or lower cutoff frequencies may be used in different portions of an IC based on performance needs.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other embodiments or teachings described herein, without limitation.

Aspect 1 is a cell on an IC, including a first set of $M_x$ layer interconnects coupled to a first voltage, and a second set of $M_x$ layer interconnects coupled to a second voltage different than the first voltage. The cell further includes a MIM capacitor structure below the $M_x$ layer. The MIM capacitor structure includes a CTM, a CBM, and an insulator between portions of the CTM and the CBM. The first set of $M_x$ layer interconnects is coupled to the CTM. The second set of $M_x$ layer interconnects is coupled to the CBM. The MIM capacitor structure is between the $M_x$ layer and an $M_{x-1}$ layer. The MIM capacitor structure includes a plurality of openings. The MIM capacitor structure is continuous within the cell and extending to at least two edges of the cell.

Aspect 2 is the cell of aspect 1, wherein the MIM capacitor structure extends to each edge of the cell.

Aspect 3 is the cell of any of aspects 1 and 2, wherein the first set of $M_x$ layer interconnects is coupled to the CTM through a plurality of vias.

Aspect 4 is the cell of any of aspects 1 to 3, wherein the second set of $M_x$ layer interconnects is coupled to the CBM through a plurality of vias.

Aspect 5 is the cell of any of aspects 1 to 4, wherein the cell has a top edge, a right edge, a bottom edge, and a left edge with a plurality of $M_x$ layer tracks extending in a first direction between the left edge and the right edge, the plurality of $M_x$ layer tracks comprising a first $M_x$ layer track adjacent to the top edge, a second $M_x$ layer track adjacent to the first $M_x$ layer track, a third $M_x$ layer track adjacent to the second $M_x$ layer track, and a fourth $M_x$ layer track adjacent to the third $M_x$ layer track and the bottom edge.

Aspect 6 is the cell of aspect 5, wherein the first set of $M_x$ layer interconnects comprises a first $M_x$ layer interconnect on the second $M_x$ layer track, and the third $M_x$ layer track is empty.

Aspect 7 is the cell of aspect 5, wherein the first set of $M_x$ layer interconnects comprises a first $M_x$ layer interconnect on the third $M_x$ layer track, and the second $M_x$ layer track is empty.

Aspect 8 is the cell of aspect 5, wherein the first set of $M_x$ layer interconnects comprises a first $M_x$ layer interconnect on the second $M_x$ layer track, and a second $M_x$ layer interconnect on the third $M_x$ layer track.

Aspect 9 is the cell of aspect 5, wherein the second set of $M_x$ layer interconnects comprises a first $M_x$ layer interconnect on the first $M_x$ layer track, and the fourth $M_x$ layer track is empty.

Aspect 10 is the cell of aspect 5, wherein the second set of $M_x$ layer interconnects comprises a first $M_x$ layer interconnect on the fourth $M_x$ layer track, and the first $M_x$ layer track is empty.

Aspect 11 is the cell of aspect 5, wherein the second set of $M_x$ layer interconnects comprises a first $M_x$ layer interconnect on the first $M_x$ layer track, and a second $M_x$ layer interconnect on the fourth $M_x$ layer track.

Aspect 12 is the cell of aspect 1, wherein the first voltage is a power supply voltage, and the second voltage is a ground voltage.

Aspect 13 is the cell of aspect 1, wherein the second voltage is a power supply voltage, and the first voltage is a ground voltage.

Aspect 14 is an IC including a plurality of abutting cells, where each cell includes a first set of $M_x$ layer interconnects coupled to a first voltage, and a second set of $M_x$ layer interconnects coupled to a second voltage different than the first voltage. Each cell further includes a MIM capacitor structure below the $M_x$ layer. The MIM capacitor structure includes a CTM, a CBM, and an insulator between portions of the CTM and the CBM. The first set of $M_x$ layer interconnects is coupled to the CTM. The second set of $M_x$ layer interconnects is coupled to the CBM. The MIM capacitor structure is between the $M_x$ layer and an $M_{x-1}$ layer. The MIM capacitor structure includes a plurality of openings. The MIM capacitor structure is continuous across the plurality of cells.

Aspect 15 is the IC of aspect 14, wherein for each cell, the first set of $M_x$ layer interconnects is coupled to the CTM through a plurality of vias.

Aspect 16 is the IC of aspect 15, wherein the plurality of abutting cells includes a first set of cells and a second set of cells. The first set of cells has a first number of vias coupling the CTM to the first voltage through at least one of the first set of $M_x$ layer interconnects. The second set of cells has a second number of vias coupling the CTM to the first voltage through at least one of the first set of $M_x$ layer interconnects. The first number of vias is different than the second number of vias.

Aspect 17 is the IC of any of aspects 14 to 16, wherein for each cell, the second set of $M_x$ layer interconnects is coupled to the CBM through a plurality of vias.

Aspect 18 is the IC of aspect 17, wherein the plurality of abutting cells includes a first set of cells and a second set of cells. The first set of cells has a first number of vias coupling the CBM to the second voltage through at least one of the second set of $M_x$ layer interconnects. The second set of cells has a second number of vias coupling the CBM to the second voltage through at least one of the second set of $M_x$ layer interconnects. The first number of vias is different than the second number of vias.

Aspect 19 is the IC of aspect 14, wherein for each cell, the cell has a top edge, a right edge, a bottom edge, and a left edge with a plurality of $M_x$ layer tracks extending in a first direction between the left edge and the right edge, the plurality of $M_x$ layer tracks comprising a first $M_x$ layer track adjacent to the top edge, a second $M_x$ layer track adjacent to the first $M_x$ layer track, a third $M_x$ layer track adjacent to the second $M_x$ layer track, and a fourth $M_x$ layer track adjacent to the third $M_x$ layer track and the bottom edge.

Aspect 20 is the IC of aspect 19, wherein for at least a subset of the cells of the plurality of cells, the first set of $M_x$ layer interconnects comprises a first $M_x$ layer interconnect on the second $M_x$ layer track, and the third $M_x$ layer track is empty.

Aspect 21 is the IC of aspect 19, wherein for at least a subset of the cells of the plurality of cells, the first set of $M_x$ layer interconnects comprises a first $M_x$ layer interconnect on the third $M_x$ layer track, and the second $M_x$ layer track is empty.

Aspect 22 is the IC of aspect 19, wherein for at least a subset of the cells of the plurality of cells, the first set of $M_x$ layer interconnects comprises a first $M_x$ layer interconnect on the second $M_x$ layer track, and a second $M_x$ layer interconnect on the third $M_x$ layer track.

Aspect 23 is the IC of aspect 19, wherein for at least a subset of the cells of the plurality of cells, the second set of $M_x$ layer interconnects comprises a first $M_x$ layer interconnect on the first $M_x$ layer track, and the fourth $M_x$ layer track is empty.

Aspect 24 is the IC of aspect 19, wherein for at least a subset of the cells of the plurality of cells, the second set of $M_x$ layer interconnects comprises a first $M_x$ layer interconnect on the fourth $M_x$ layer track, and the first $M_x$ layer track is empty.

Aspect 25 is the IC of aspect 19, wherein for at least a subset of the cells of the plurality of cells, the second set of $M_x$ layer interconnects comprises a first $M_x$ layer interconnect on the first $M_x$ layer track, and a second $M_x$ layer interconnect on the fourth $M_x$ layer track.

Aspect 26 is the IC of any of aspects 14 to 25, wherein the first voltage is a power supply voltage, and the second voltage is a ground voltage.

Aspect 27 is the IC of any of aspects 14 to 25, wherein the second voltage is a power supply voltage, and the first voltage is a ground voltage.

Aspect 28 is the IC of any of aspects 14 to 27, wherein for each cell, the MIM capacitor structure is continuous within the cell and extends to at least two edges of the cell.

Aspect 29 is the IC of any of aspects 14 to 28, wherein for each cell, the MIM capacitor structure is continuous within the cell and extends to each edge of the cell.

What is claimed is:

1. A cell on an integrated circuit (IC), comprising:
   a first set of metal x ($M_x$) layer interconnects coupled to a first voltage;
   a second set of $M_x$ layer interconnects coupled to a second voltage different than the first voltage; and
   a metal insulator metal (MIM) capacitor structure below the $M_x$ layer, the MIM capacitor structure including a capacitor top metal (CTM), a capacitor bottom metal (CBM), and an insulator between portions of the CTM and the CBM, the first set of $M_x$ layer interconnects being coupled to the CTM, the second set of $M_x$ layer interconnects being coupled to the CBM, the MIM capacitor structure being between the $M_x$ layer and a metal x-1 ($M_{x-1}$) layer, the MIM capacitor structure comprising a plurality of openings, the MIM capacitor structure being continuous within the cell and extending to at least two edges of the cell,
   wherein the cell has a top edge, a right edge, a bottom edge, and a left edge with a plurality of $M_x$ layer tracks extending in a first direction between the left edge and the right edge, the plurality of $M_x$ layer tracks comprising a first $M_x$ layer track adjacent to the top edge, a second $M_x$ layer track adjacent to the first $M_x$ layer track, a third $M_x$ layer track adjacent to the second $M_x$ layer track, and a fourth $M_x$ layer track adjacent to the third $M_x$ layer track and the bottom edge.

2. The cell of claim 1, wherein the MIM capacitor structure extends to each edge of the cell.

3. The cell of claim 1, wherein the first set of $M_x$ layer interconnects is coupled to the CTM through a plurality of vias.

4. The cell of claim 1, wherein the second set of $M_x$ layer interconnects is coupled to the CBM through a plurality of vias.

5. The cell of claim 1, wherein the first set of $M_x$ layer interconnects comprises a first $M_x$ layer interconnect on the second $M_x$ layer track, and the third $M_x$ layer track is empty.

6. The cell of claim 1, wherein the first set of $M_x$ layer interconnects comprises a first $M_x$ layer interconnect on the third $M_x$ layer track, and the second $M_x$ layer track is empty.

7. The cell of claim 1, wherein the first set of $M_x$ layer interconnects comprises a first $M_x$ layer interconnect on the second $M_x$ layer track, and a second $M_x$ layer interconnect on the third $M_x$ layer track.

8. The cell of claim 1, wherein the second set of $M_x$ layer interconnects comprises a first $M_x$ layer interconnect on the first $M_x$ layer track, and the fourth $M_x$ layer track is empty.

9. The cell of claim 1, wherein the second set of $M_x$ layer interconnects comprises a first $M_x$ layer interconnect on the fourth $M_x$ layer track, and the first $M_x$ layer track is empty.

10. The cell of claim 1, wherein the second set of $M_x$ layer interconnects comprises a first $M_x$ layer interconnect on the first $M_x$ layer track, and a second $M_x$ layer interconnect on the fourth $M_x$ layer track.

11. The cell of claim 1, wherein the first voltage is a power supply voltage, and the second voltage is a ground voltage.

12. The cell of claim 1, wherein the second voltage is a power supply voltage, and the first voltage is a ground voltage.

13. An integrated circuit (IC), comprising:
    a plurality of abutting cells, each cell comprising:
    a first set of metal x ($M_x$) layer interconnects coupled to a first voltage;
    a second set of $M_x$ layer interconnects coupled to a second voltage different than the first voltage; and
    a metal insulator metal (MIM) capacitor structure below the $M_x$ layer, the MIM capacitor structure including a capacitor top metal (CTM), a capacitor bottom metal (CBM), and an insulator between portions of the CTM and the CBM, the first set of $M_x$ layer interconnects being coupled to the CTM, the second set of $M_x$ layer interconnects being coupled to the CBM, the MIM capacitor structure being between the $M_x$ layer and a metal x-1 ($M_{x-1}$) layer, the MIM capacitor structure comprising a plurality of openings, the MIM capacitor structure being continuous across the plurality of cells.

14. The IC of claim 13, wherein for each cell, the first set of $M_x$ layer interconnects is coupled to the CTM through a plurality of vias.

15. The IC of claim 14, wherein the plurality of abutting cells comprises a first set of cells and a second set of cells, the first set of cells having a first number of vias coupling the CTM to the first voltage through at least one of the first set of $M_x$ layer interconnects, the second set of cells having a second number of vias coupling the CTM to the first voltage through at least one of the first set of $M_x$ layer interconnects, the first number of vias being different than the second number of vias.

16. The IC of claim 13, wherein for each cell, the second set of $M_x$ layer interconnects is coupled to the CBM through a plurality of vias.

17. The IC of claim 16, wherein the plurality of abutting cells comprises a first set of cells and a second set of cells, the first set of cells having a first number of vias coupling the CBM to the second voltage through at least one of the second set of $M_x$ layer interconnects, the second set of cells having a second number of vias coupling the CBM to the second voltage through at least one of the second set of $M_x$ layer interconnects, the first number of vias being different than the second number of vias.

18. The IC of claim 13, wherein for each cell, the cell has a top edge, a right edge, a bottom edge, and a left edge with a plurality of $M_x$ layer tracks extending in a first direction between the left edge and the right edge, the plurality of $M_x$ layer tracks comprising a first $M_x$ layer track adjacent to the top edge, a second $M_x$ layer track adjacent to the first $M_x$ layer track, a third $M_x$ layer track adjacent to the second $M_x$ layer track, and a fourth $M_x$ layer track adjacent to the third $M_x$ layer track and the bottom edge.

19. The IC of claim 18, wherein for at least a subset of the cells of the plurality of cells, the first set of $M_x$ layer interconnects comprises a first $M_x$ layer interconnect on the second $M_x$ layer track, and the third $M_x$ layer track is empty.

20. The IC of claim 18, wherein for at least a subset of the cells of the plurality of cells, the first set of $M_x$ layer interconnects comprises a first $M_x$ layer interconnect on the third $M_x$ layer track, and the second $M_x$ layer track is empty.

21. The IC of claim 18, wherein for at least a subset of the cells of the plurality of cells, the first set of $M_x$ layer interconnects comprises a first $M_x$ layer interconnect on the second $M_x$ layer track, and a second $M_x$ layer interconnect on the third $M_x$ layer track.

22. The IC of claim 18, wherein for at least a subset of the cells of the plurality of cells, the second set of $M_x$ layer interconnects comprises a first $M_x$ layer interconnect on the first $M_x$ layer track, and the fourth $M_x$ layer track is empty.

23. The IC of claim 18, wherein for at least a subset of the cells of the plurality of cells, the second set of $M_x$ layer interconnects comprises a first $M_x$ layer interconnect on the fourth $M_x$ layer track, and the first $M_x$ layer track is empty.

24. The IC of claim 18, wherein for at least a subset of the cells of the plurality of cells, the second set of $M_x$ layer interconnects comprises a first $M_x$ layer interconnect on the first $M_x$ layer track, and a second $M_x$ layer interconnect on the fourth $M_x$ layer track.

25. The IC of claim 13, wherein the first voltage is a power supply voltage, and the second voltage is a ground voltage.

26. The IC of claim 13, wherein the second voltage is a power supply voltage, and the first voltage is a ground voltage.

27. The IC of claim 13, wherein for each cell, the MIM capacitor structure is continuous within the cell and extends to at least two edges of the cell.

28. The IC of claim 27, wherein for each cell, the MIM capacitor structure is continuous within the cell and extends to each edge of the cell.

* * * * *